United States Patent
Lee et al.

(10) Patent No.: US 7,864,229 B2
(45) Date of Patent: Jan. 4, 2011

(54) ANALOG TO DIGITAL CONVERTING DEVICE AND IMAGE PICKUP DEVICE FOR CANCELING NOISE, AND SIGNAL PROCESSING METHOD THEREOF

(75) Inventors: Myoung Su Lee, Seoul (KR); June Soo Han, Seoul (KR); Kyung-Min Kim, Suwon-si (KR); Kyung Min Shin, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 94 days.

(21) Appl. No.: 12/230,882

(22) Filed: Sep. 5, 2008

(65) Prior Publication Data

US 2009/0160984 A1    Jun. 25, 2009

Related U.S. Application Data

(63) Continuation-in-part of application No. 11/524,436, filed on Sep. 21, 2006.

(30) Foreign Application Priority Data

Dec. 8, 2005    (KR)    ............ 10-2005-0119815

(51) Int. Cl.
*H04N 5/217* (2006.01)
*H04N 9/64* (2006.01)

(52) U.S. Cl. .................. 348/241; 348/243
(58) Field of Classification Search .......... 348/243
See application file for complete search history.

(56) References Cited

U.S. PATENT DOCUMENTS

| | | | |
|---|---|---|---|
| 5,982,318 A * | 11/1999 | Yiannoulos | 341/155 |
| 6,829,007 B1 * | 12/2004 | Bilhan et al. | 348/243 |
| 7,282,685 B2 * | 10/2007 | Boemler | 250/208.1 |
| 7,286,170 B2 | 10/2007 | Inui et al. | |
| 7,405,546 B2 | 7/2008 | Amrani et al. | |
| 7,408,138 B2 * | 8/2008 | Lee | 250/208.1 |
| 7,408,577 B2 * | 8/2008 | Nakamura et al. | 348/308 |
| 7,518,539 B2 * | 4/2009 | Han et al. | 341/155 |
| 2003/0146369 A1 | 8/2003 | Kokubu | |
| 2003/0202111 A1 * | 10/2003 | Park | 348/243 |
| 2003/0214597 A1 * | 11/2003 | Nam | 348/308 |
| 2005/0243194 A1 | 11/2005 | Xu | |
| 2006/0181337 A1 | 8/2006 | Dreps et al. | |
| 2007/0132868 A1 | 6/2007 | Lee et al. | |

FOREIGN PATENT DOCUMENTS

| | | |
|---|---|---|
| JP | 2003-234962 A | 8/2003 |
| JP | 2004-153682 A | 5/2004 |
| KR | 10-2007-0060437 A | 6/2007 |
| WO | WO 2006/083490 A2 | 8/2006 |
| WO | WO 2006/083490 A3 | 8/2006 |

* cited by examiner

*Primary Examiner*—Ngoc-Yen T Vu
(74) *Attorney, Agent, or Firm*—Lee & Morse, P.C.

(57) ABSTRACT

An image pick-up device includes a first correlated double sampling circuit configured to generate a first sampling signal by performing correlated double sampling on an active pixel signal output from an active pixel and generating a first comparison signal by comparing the first sampling signal with a reference signal, and a second correlated double sampling circuit to generate a second sampling signal by performing correlated double sampling on an OB pixel signal output from an optical black pixel and generating a second comparison signal by comparing the second sampling signal with the reference signal.

9 Claims, 3 Drawing Sheets

US 7,864,229 B2

ANALOG TO DIGITAL CONVERTING DEVICE AND IMAGE PICKUP DEVICE FOR CANCELING NOISE, AND SIGNAL PROCESSING METHOD THEREOF

CROSS-REFERENCE TO RELATED APPLICATIONS

This application is a continuation-in-part of application Ser. No. 11/524,436, filed on Sep. 21, 2006, which is hereby incorporated by reference in its entirety for all purposes.

BACKGROUND

1. Field

Example embodiments relate to a semiconductor device. More particularly, example embodiments relate to an analog to digital converting device, an image pick-up device capable of canceling noise, and a signal processing method of the image pick-up device.

2. Description of the Related Art

An image pick-up device is a semiconductor device converting an optical image to an electric signal. Generally, image pick-up devices using a charge coupled device (CCD) or a complimentary metal oxide semiconductor (CMOS) image sensor (CIS) have been widely employed.

Using a CIS is economical compared to using a CCD, since a CIS may be made using general CMOS processes and may be integrated with an analog to digital converter (ADC) on a chip. In addition, as a CIS may be designed to operate using low-power and low-voltages, CIS devices are widely used in portable devices, e.g., mobile phones, digital cameras, and so forth.

A CIS, different from a CCD, requires conversion of an analog signal output from an active pixel sensor (APS) array into a digital signal. A high resolution analog to digital converter (ADC) is used in a CIS for such conversion. The CIS may be divided into a single ADC method and a column ADC method according to how the ADC is embodied. A single ADC method converts APS analog output signals output from all columns into digital signals within a predetermined time using one ADC operating at high speed. The single ADC method may provide a reduced CIS chip size. However, due to such high speed operation, the single ADC method consumes a large amount of power.

On the other hand, the column ADC method includes arranging a simple ADC circuit for each column. The column ADC method provides lower power consumption, but has a large CIS chip size. The column ADC method performs correlated double sampling (CDS) on an analog output voltage, e.g., a pixel output signal, stores a voltage corresponding to a performance result, compares a voltage generated in CDS operation with a predetermined reference voltage in response to a ramp signal generated by a ramp signal generator, and outputs a comparison signal from which a digital signal is generated.

Recently, as a demand for high resolution images increases, many companies are developing CIS devices having high resolution. Such high resolution CIS devices include smaller pixels. In this case, image deterioration by power supply noise output from a pixel becomes a big issue and a technique to cancel such image deterioration is greatly needed.

A differential comparator of a CDS circuit used in a conventional column ADC method has good noise property for power supply noise generated by a CDS block itself and for coupling noise due to switching. However, it does not efficiently cope with power supply noise generated by a pixel outside of a CDS block.

SUMMARY

One or more aspects of the invention is therefore directed to signal generators and methods for generating signals, which may be employable by image sensors and which substantially overcome one or more of the problems due to the limitations and disadvantages of the related art.

An example embodiment is directed to an analog to digital converting device, including a first correlated double sampling (CDS) circuit configured to generate a first sampling signal by performing CDS on an active pixel output signal output from an active pixel and to generate a first comparison signal by comparing the first sampling signal with a reference signal, and a second CDS circuit configured to generate a second sampling signal by performing CDS on an OB pixel output signal output from an optical black (OB) pixel and to generate a second comparison signal by comparing the second sampling signal with the reference signal.

The first CDS circuit may be configured to generate the first sampling signal in response to a ramp signal and the active pixel output signal. The second CDS circuit may be configured to generate the second sampling signal in response to a DC signal and the OB pixel output signal.

The device may include a reference signal generator configured to output the second sampling signal or a signal related to the DC signal as the reference signal in response to a switching signal. The reference signal generator may include a first buffering circuit configured to generate the mid signal by buffering an input analog signal, a second buffering circuit configured to generate the DC signal by buffering the mid signal, a switch configured to output an output signal of the first buffering circuit or one of the second sampling and second comparison signals in response to the switching signal, and a third buffering circuit configured to generate the reference signal by buffering an output signal of the switch.

The second CDS circuit may include a differential comparator including a first input terminal and a second input terminal, the second input terminal receiving the reference signal, a first switch configured to control transmission of the OB pixel output signal, a second switch configured to control transmission of the DC signal, a capacitor between an output of the first switch and an output of the second switch, a signal storing capacitor between the output of the first switch and the first input terminal, the signal storing capacitor providing the second sampling signal to the first input terminal of the differential capacitor, and a third switch connected between an output terminal of the differential comparator and the first input terminal.

The device may include a first buffering circuit configured to generate a mid signal by buffering an input analog signal, a second buffering circuit configured to generate the DC signal by buffering the mid signal, a fourth switch configured to output a signal input to the first input terminal or an output signal of the first buffering circuit in response to a switching signal, and a third buffering circuit configured to generate the reference signal by buffering an output signal of the fourth switch.

Another example embodiment is directed to an image pick-up device, including an active pixel array configured to output an active pixel output signal in response to a plurality of control signals, an optical black (OB) pixel array configured to output an OB pixel output signal in response to the plurality of control signals, a first correlated double sampling (CDS)

circuit configured to generate a first sampling signal by performing CDS sampling on the active pixel output signal and to generate a first comparison signal by comparing the first sampling signal with a reference signal, and a second CDS circuit configured to generate a second sampling signal by performing CDS sampling on the OB pixel output signal and to generate a second comparison signal by comparing the second sampling signal with the reference signal.

Yet another example embodiment is directed to a signal processing method of an image pick-up device, the method including generating a reference signal, generating a first sampling signal by performing correlated double sampling on an active pixel output signal output from an active pixel, first comparing the first sampling signal with the reference signal, outputting a first comparison signal, for generating a digital signal, resulting from first comparing, generating a second sampling signal by performing correlated double sampling on an OB pixel output signal output from an optical black (OB) pixel, second comparing the second sampling signal with the reference signal, and outputting a second comparison signal resulting from second comparing.

The method may include generating the first sampling signal is in accordance with a ramp signal and the active pixel output signal, and generating the second sampling signal is in accordance with a DC signal and the OB pixel output signal.

Generating the reference signal may include outputting a mid signal related to the DC signal or the second sampling signal in response to a switching signal. Generating the reference signal may further include generating the mid signal by buffering an input analog signal, generating the DC signal by buffering the mid signal, switching between the mid signal and one of the second sampling and second comparison signals in response to the switching signal, and outputting the reference signal by buffering an output signal from switching.

Outputting the second comparison signal may include supplying the reference signal to a second input terminal of a differential comparator, controlling transmission of the OB pixel output signal using a first switch, controlling transmission of the DC signal using a second switch, supplying the second sampling signal to a first input terminal of the differential comparator from a signal storing capacitor between the output of the first switch and the first input terminal, and controlling supply of the second sampling signal and the second comparison signal to the first input terminal using a third switch.

The method may include generating a mid signal by buffering an input analog signal, generating the DC signal by buffering the mid signal, supplying a signal input to the first input terminal or the mid signal in response to a switching signal, and generating the reference signal by buffering an output of supplying.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
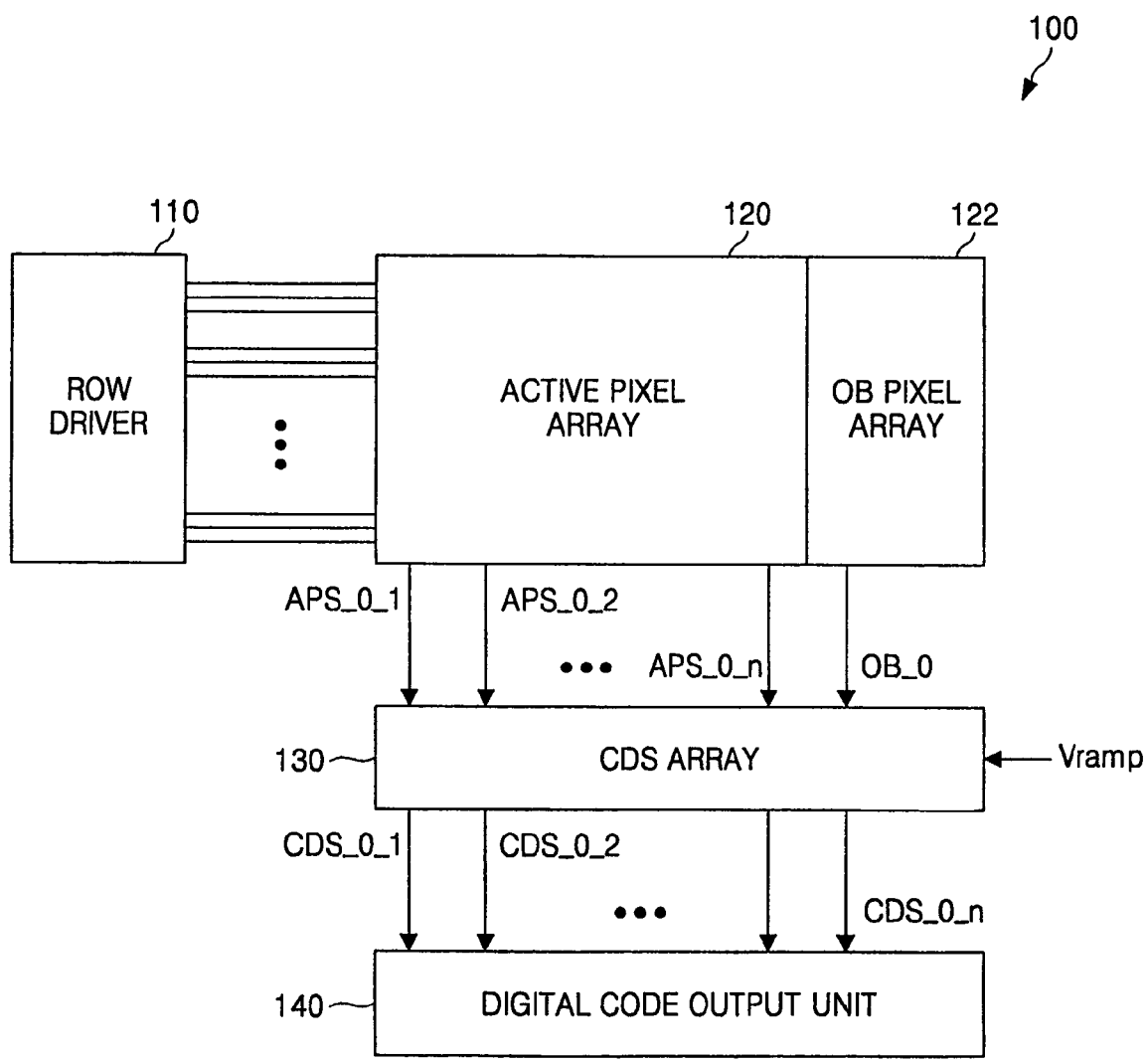
FIG. 1 illustrates a schematic block diagram of an image pick-up device according to an example embodiment.

Korean Patent Application No. 10-2005-0119815, filed on Dec. 8, 2005, in the Korean Intellectual Property Office, and entitled: "Signal Generator and Method for Generating Signals for Reducing Noise in Signals," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

A conventional CDS array of a conventional image pick-up device may include a first CDS circuit configured to perform CDS on an active pixel output signal from an active pixel array, and a second CDS circuit configured to perform CDS on an optical black (OB) pixel output signal from an OB pixel array. Due to a difference between a first reference signal supplied to the first CDS circuit and a second reference signal supplied to the second CDS circuit, and due to a difference of capacitance between respective capacitors in the first and second CDS circuits, a mismatch is created between a power supply rejection ratio (PSRR) of a differential comparator in the first CDS circuit and a PSRR of a differential comparator in the second CDS circuit. In particular, a noise term may remain in an output of the differential comparator in the first CDS circuit.

Figure 2:
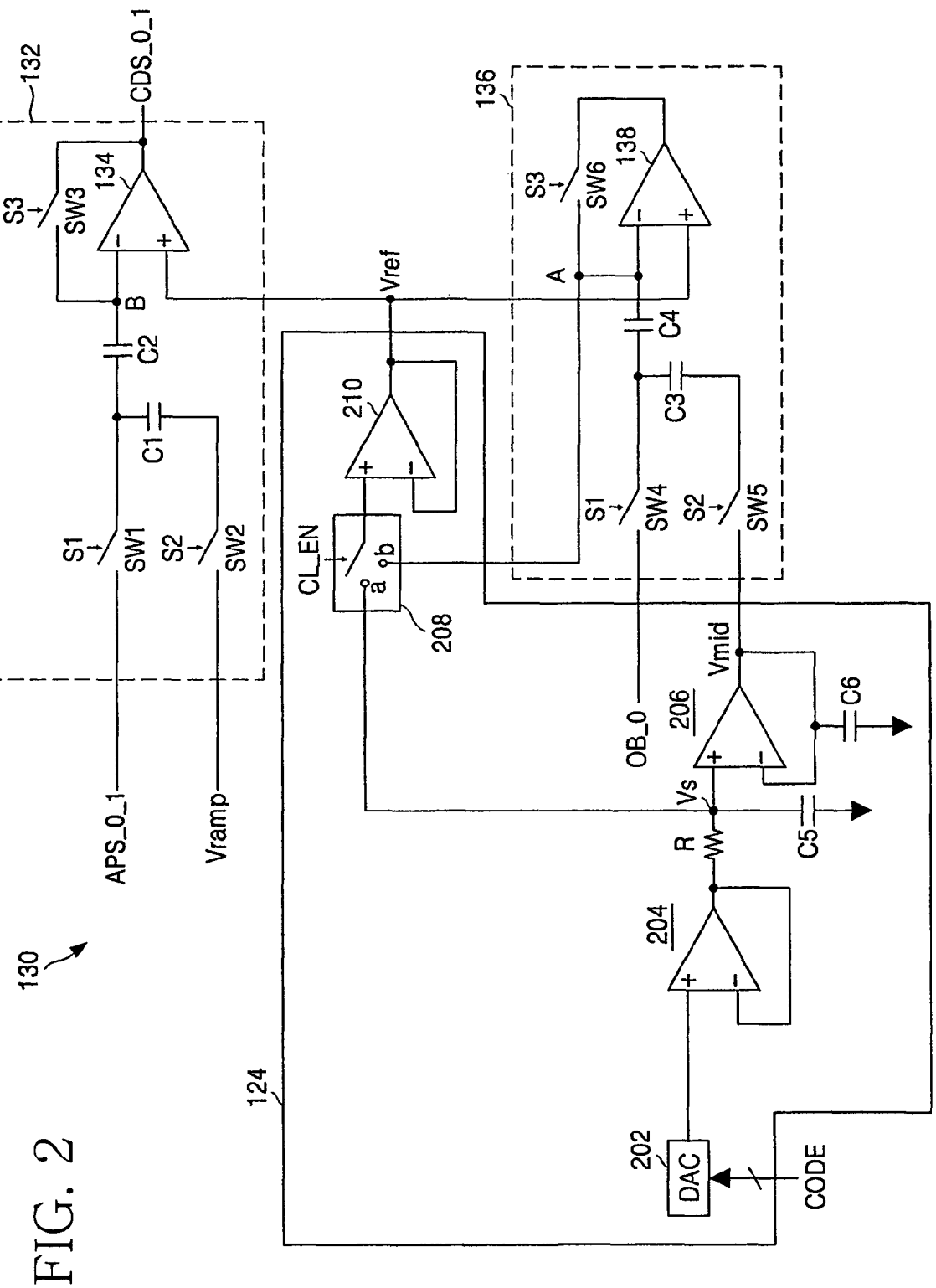
FIG. 2 illustrates a schematic circuit diagram of a CDS array illustrated in FIG. 1.

Therefore, an image pick-up device according to an example embodiment as illustrated in FIGS. 1 and 2 may have a structure capable of canceling the mismatch. FIG. 1 illustrates a schematic block diagram of an image pick-up device according to an example embodiment. FIG. 2 illustrates a schematic circuit diagram of a CDS array illustrated in FIG. 1.

Referring to FIG. 1, a CMOS image sensor 100 used as an example of an image pick-up device may include a row driver 110, an active pixel array 120, a CDS array 130, and a digital code output unit 140. The CMOS image sensor 100 may also include an optical black (OB) pixel array 122.

The CMOS image sensor 100 may use a column ADC method. The image pick-up device may be used in a digital camera or a mobile phone having a digital camera built-in.

The row driver 110 may generate a plurality of control signals for controlling an operation of each pixel respectively in the active pixel array 120 and the OB pixel array 122. The active pixel array 120 may output each active pixel output signal APS_O_1~APS_O_n (where n is a natural number) from each column to the CDS array 130 in response to the plurality of control signals. The OB pixel array 122 may output an OB pixel output signal OB_O, which is a column output signal, to the CDS array 130 in response to the plurality of control signals.

A power supply (not shown) may provide power to both the active pixel array 120 and the OB pixel array 122. Thus, power supply noise generated in the active pixel array 120 is also generated in the OB pixel array 122. In addition, different from the active pixel array 120, an upper part of the OB pixel array 122 may include a light cut-off material. Thus, the OB pixel array 122 may transmit power supply noise to the CDS array 130 efficiently using a black level signal.

Referring to FIG. 2, the CDS array 130 may include a reference voltage generator 124, an active CDS circuit 132, and an OB CDS circuit 136. The reference voltage generator 124 may supply a reference signal Vref to a differential comparator 134 of the active CDS circuit 132 and to a differential comparator 138 of the OB CDS circuit 136 to cancel power supply noise. In other words, the differential comparator 134 of the active CDS circuit 132 and the differential comparator 138 of the OB CDS circuit 136 may share the reference signal Vref. Therefore, a mismatch between a PSRR of the differential comparator 134 and a PSRR of the differential comparator 138 may be cancelled.

For simplicity of explanation, a single active CDS circuit 132 and a single OB CDS circuit 136 are illustrated in FIG. 2. However, the CDS array 130 may include n active CDS circuits, which have substantially the same structure as the active CDS circuit 132, and at least an OB CDS circuit substantially having the same structure as the OB CDS circuit 136.

The active CDS 132 may generate a first sampling signal, e.g., an active sampling signal, by performing CDS on an active pixel output signal APS_O_1 output from an active pixel in the active pixel array 120, and may generate a first comparison signal CDS_O_1 for generating a digital signal by comparing the first sampling signal with the reference signal Vref. For example, the active CDS circuit 132 may generate the first sampling signal in response to a ramp signal Vramp and an active pixel output signal APS_O_1.

The OB CDS circuit 136 may generate a second sampling signal, e.g., an OB sampling signal, by performing CDS on an OB pixel output signal OB_O output from an OB pixel in the OB pixel array 122, and may generate a second comparison signal by comparing the second sampling signal with the reference signal Vref. For example, the OB CDS circuit 136 may generate the second sampling signal in response to a DC signal Vmid and the OB pixel output signal OB_O.

The reference signal generator 124 may output a signal to a second input terminal, e.g., a positive (+) input terminal, of the differential comparator 138 of the OB CDS circuit 136. For example, the reference signal Vref may be the second sampling signal or an output signal of a first buffering circuit 204 (i.e, a mid signal Vs).

While the reference signal generator 124 is illustrated in FIG. 2 as part of the CDS array 130, the reference signal generator 124 may be external to the CDS array 130 according to an example embodiment. Here, the CDS array 130 may perform a function of a column ADC device using a column ADC method.

The active CDS circuit 132 may include a plurality of switches SW1, SW2, and SW3, e.g., transistors, etc., a plurality of capacitors C1 and C2, and the differential comparator 134. The plurality of switches SW1, SW2, and SW3 may be respectively switched in response to each switching signal S1, S2, and S3, respectively. The differential comparator 134 may be embodied as, e.g., a differential amplifier or an operational amplifier.

The first switch SW1 may control transmission of the active pixel output signal APS_O_1 in response to the first switching signal S1. The second switch SW2 may control transmission of the ramp signal Vramp in response to the second switching signal S2. The third switch SW3 may control feedback of an output signal of the differential comparator 134, i.e., the first comparison signal CDS_O_1, to the first input terminal, e.g., a negative (−) input terminal, of the differential comparator 134 in response to the third switching signal S3.

The first capacitor C1 may be connected between an output of the first switch SW1 and an output of the second switch SW2. The second capacitor C2 may be connected between an output of a first switch SW1 and the first input terminal, e.g., the negative (−) input terminal, of the differential comparator 134. The first capacitor C1 may transmit only a voltage variation regardless of a DC level of the ramp signal Vramp. The second capacitor C2 may output the first sampling signal. The differential comparator 134 may generate the first comparison signal CDS_O_1 from which the digital signal is generated by comparing the first sampling signal input to the first input terminal thereof, e.g., the negative (−) input terminal, with the reference signal Vref input to the second input terminal thereof, e.g., a positive (+) input terminal.

Figure 3:
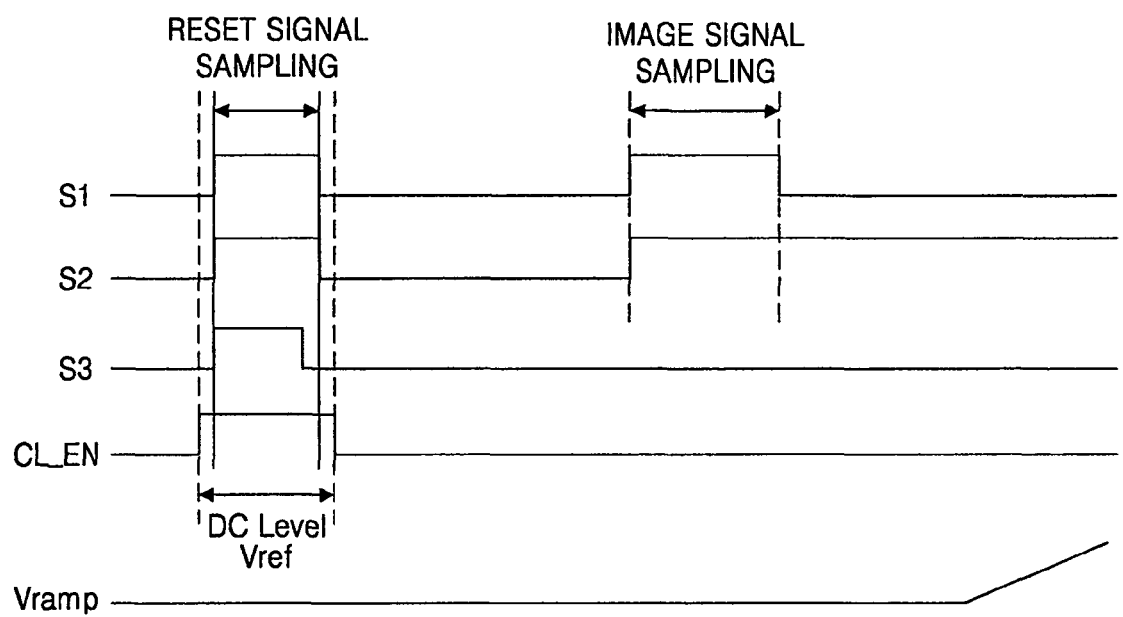
FIG. 3 illustrates a timing diagram explaining operations of the image pick-up device illustrated in FIG. 2.

The OB CDS circuit 136 may include a plurality of switches SW4, SW5, and SW6, a plurality of capacitors C3 and C4, and the differential comparator 138. The plurality of switches SW4, SW5, and SW6 may be respectively switched in response to each switching signal S1, S2, and S3, respectively. The timing diagram for each switching signal S1, S2, and S3 is illustrated in FIG. 3.

The fourth switch SW4 may control transmission of the OB pixel output signal OB_O in response to the first switching signal S1. The fifth switch SW5 may control transmission of an output signal of a second buffering circuit 206, i.e., a DC signal Vmid, in the reference signal generator 124 in response to the second switching signal S2. The sixth switch SW6 may control feedback of the output signal of the differential comparator 138 to the first input terminal, e.g., a negative (−) input terminal, of the differential comparator 138 in response to the third switching signal S3.

The third capacitor C3 may be connected between an output of the fourth switch SW4 and an output of the fifth switch SW5. The fourth capacitor C4 may be connected between an output of the fourth switch SW4 and the first input terminal, e.g., a negative (−) input terminal, of the differential comparator 138. The third capacitor C3 may transmit a voltage variation only regardless of a DC level of the DC signal Vmid. The fourth capacitor C4 may provide the second sampling signal.

The differential comparator 138 may generate the second comparison signal by comparing the second sampling signal input to the first input terminal, e.g., a negative (−) input terminal, with the reference signal Vref. The differential comparator 138 may be embodied as a differential amplifier or an operational amplifier.

The reference signal generator 124 may include a digital to analog converter (DAC) 202 generating an analog signal which corresponds to an input digital code CODE, a first buffering circuit 204 generating a mid signal Vs by buffering an output signal of the DAC 202, the second buffer buffering circuit 206 generating the DC signal Vmid by buffering an output signal Vs of the first buffering circuit 204, a switch 208 outputting a voltage input to the first input terminal of the differential comparator 138 or the output signal Vs of the first buffering circuit 204 in response to a switching signal CL_EN, and a third buffering circuit 210 generating the reference signal Vref by buffering an output signal of the switch 208.

The switch 208 may output the output signal Vs of the first buffering circuit 204 to the third buffering circuit 210 when connected to a terminal "a" in a reset signal sampling section and may output the voltage input to the first input terminal of the differential comparator 138 to the third buffering circuit 210 when connected to a terminal "b" in an image signal sampling section.

According to the switching operation of the sixth switch SW6 which responds to the third switching signal S3, a voltage of a terminal "b" may be the second sampling signal input to the first input terminal of the differential comparator 138 or the second comparison signal fed back to the first input terminal of the differential comparator 138.

Each buffering circuit 204, 206, and 210 may be embodied as a unit gain buffer. In addition, the first buffering circuit 204 may include a resistor R and a fifth capacitor C5. Accordingly, the first buffering circuit 204 may generate the mid signal Vs that is a DC signal. The second buffering circuit 206 may further include a sixth capacitor C6 connected between an output terminal of a unit gain buffer and ground. Accordingly, the second buffering circuit 206 may generate the DC signal Vmid.

Each switching signal S1, S2, and S3 and the switching signal CL_EN may be generated from a timing controller (not shown).

Referring back to FIG. 1, the digital code output unit 140 may generate each digital code value for digital signal processing in an image signal processor ISP in response to each comparison signal CDS_O_1 to CDS_O_n output from the CDS array 130.

Referring to FIGS. 2 and 3, a process of canceling power supply noise is described. As can be seen in FIG. 3, during a reset signal sampling, all three signals S1 to S3 start high, with the third signal S3 switching to low. Thus, the six switches SW1 to SW6 are closed. Further, the CL_EN is high. Thus, the switch 208 is connected to the terminal "a." During an image signal sampling, signals S1 and S2 are high, while the signals S3 and CL_EN are low. Thus, switches SW1, SW2, SW4 and SW5 are closed, switches SW3 and SW6 are open, and the switch 208 is connected to the terminal "b."

A voltage VB of the first input terminal, e.g., the negative (−) input terminal, of the differential comparator 134 may be given as equation 1 as follows.

$$VB = Vsig + Ns - (Vres + Nr - Vmid + \alpha) + (c\Delta Vramp) + Nramp \quad \text{(Equation 1)}$$

Vsig is a voltage output from an active pixel and input to the first input terminal of the differential comparator 134 in an image signal sampling section. Ns is noise input to the first input terminal of the differential comparator 134 in the image signal sampling section. Vres is a reset voltage output from an OB pixel and input to the first input terminal of the differential comparator 134 in a reset signal sampling section. Nr is noise input to the first input terminal of the differential comparator 134 in the reset signal sampling section. Vmid is an output voltage of the second buffering circuit 206 input to the first input terminal of the differential comparator 134 in the reset signal sampling section. Power supply noise α from an OB pixel is transmitted to an A node in the reset signal sampling section. (cΔVramp) is voltage variation according to a change of the ramp signal Vramp in the ramp section, where c is a constant. Nramp is power supply noise generated in the ramp section.

A voltage VA of the second input terminal, e.g., the positive (+) input terminal, of the differential comparator 134 may be represented by equation 2 as follows.

$$VA = V_{OB} + Ns - (Vres + Nr - Vmid + \alpha) + Nvmid \quad \text{(Equation 2)}$$

$V_{OB}$ is a voltage input to the second input terminal of the differential comparator 134 after being output from an OB pixel in an image signal sampling section. Ns is noise input to the second input terminal of the differential comparator 134 in the image signal sampling section. Vres is the reset voltage output from an OB pixel and input to the second input terminal of the differential comparator 134 in a reset signal sampling section. Nr is noise input to the second input terminal of the differential comparator 134 in the reset signal sampling section. Vmid is the output voltage of the second buffering circuit 206, which is input to the second input terminal of the differential comparator 134 in the reset signal sampling section. Power supply noise α is generated from an OB pixel transmitted to an A node in the reset signal sampling section. Nvmid is power supply noise generated in the second buffering circuit 206. Here, Nramp equals to Nvmid.

The difference between the voltage VB of a negative (−) input terminal and the voltage VA of a positive (+) input terminal of the differential comparator 134 may be explained in equation 3 as follows.

$$VB - VA = Vsig - V_{OB} + (c\Delta Vramp) \quad \text{(Equation 3)}$$

Equation 3 does not include a noise term, i.e., the noise in the voltage VB equals the noise in the voltage signal VA, i.e., are both equal to a and cancel each other out. Therefore, the differential comparator 134 embodied in the CDS array 130 according to an example embodiment of the present invention may perform as an ideal differential comparator. The image pick-up device 100 having a structure according to an example embodiment may also be capable of canceling noise in a wide frequency range. An analog to digital converting device and an image pick-up device according to an example embodiment of the present invention may reduce or cancel power supply noise.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An analog to digital converting device, comprising:
a first correlated double sampling (CDS) circuit configured to generate a first sampling signal by performing CDS on an active pixel output signal output from an active pixel and to generate a first comparison signal by comparing the first sampling signal with a reference signal, the first CDS circuit being configured to generate the first sampling signal in response to a ramp signal and the active pixel output signal;
a second CDS circuit configured to generate a second sampling signal by performing CDS on an OB pixel output signal output from an optical black (OB) pixel and to generate a second comparison signal by comparing the second sampling signal with the reference signal, the second CDS circuit being configured to generate the second sampling signal in response to a DC signal and the OB pixel output signal; and
a reference signal generator configured to output the second sampling signal or a signal related to the DC signal as the reference signal in response to a switching signal, wherein the reference signal generator includes:
a first buffering circuit configured to generate a mid signal by buffering an input analog signal;
a second buffering circuit configured to generate the DC signal by buffering the mid signal;
a switch configured to output an output signal of the first buffering circuit or one of the second sampling and second comparison signals in response to the switching signal; and
a third buffering circuit configured to generate the reference signal by buffering an output signal of the switch.

2. An analog to digital converting device, comprising:
a first correlated double sampling (CDS) circuit configured to generate a first sampling signal by performing CDS on an active pixel output signal output from an active pixel and to generate a first comparison signal by comparing the first sampling signal with a reference signal, the first CDS circuit being configured to generate the first sampling signal in response to a ramp signal and the active pixel output signal; and
a second CDS circuit configured to generate a second sampling signal by performing CDS on an OB pixel output signal output from an optical black (OB) pixel and to generate a second comparison signal by comparing the second sampling signal with the reference signal,
the second CDS circuit being configured to generate the second sampling signal in response to a DC signal and the OB pixel output signal, wherein the second CDS circuit includes:
 a differential comparator including a first input terminal and a second input terminal, the second input terminal receiving the reference signal;
 a first switch configured to control transmission of the OB pixel output signal;
 a second switch configured to control transmission of the DC signal;
 a capacitor between an output of the first switch and an output of the second switch;
 a signal storing capacitor between the output of the first switch and the first input terminal, the signal storing capacitor providing the second sampling signal to the first input terminal of the differential comparator; and
 a third switch connected between an output terminal of the differential comparator and the first input terminal.

3. The device as claimed in claim 2, further comprising:
a first buffering circuit configured to generate a mid signal by buffering an input analog signal;
a second buffering circuit configured to generate the DC signal by buffering the mid signal;
a fourth switch configured to output a signal input to the first input terminal or an output signal of the first buffering circuit in response to a switching signal; and
a third buffering circuit configured to generate the reference signal by buffering an output signal of the fourth switch.

4. An image pick-up device, comprising:
an active pixel array configured to output an active pixel output signal in response to a plurality of control signals;
an optical black (OB) pixel array configured to output an OB pixel output signal in response to the plurality of control signals;
a first correlated double sampling (CDS) circuit configured to generate a first sampling signal by performing CDS sampling on the active pixel output signal and to generate a first comparison signal by comparing the first sampling signal with a reference signal, the first CDS circuit being configured to generate the first sampling signal in response to a ramp signal and the active pixel output signal;
a second CDS circuit configured to generate a second sampling signal by performing CDS sampling on the OB pixel output signal and to generate a second comparison signal by comparing the second sampling signal with the reference signal, the second CDS circuit being configured to generate the second sampling signal in response to a DC signal and the OB pixel output signal; and
a reference signal generator configured to output the second sampling signal or a signal related to the DC signal as the reference signal in response to a switching signal, wherein the reference signal generator further includes:
 a first buffering circuit configured to generate a mid signal by buffering an input analog signal;
 a second buffering circuit configured to generate the DC signal by buffering the mid signal;
 a switch configured to output one of the second sampling and second comparison signals or an output signal of the first buffering circuit in response to the switching signal; and
 a third buffering circuit configured to generate the reference signal by buffering an output signal of the switch.

5. An image pick-up device, comprising:
an active pixel array configured to output an active pixel output signal in response to a plurality of control signals;
an optical black (OB) pixel array configured to output an OB pixel output signal in response to the plurality of control signals;
a first correlated double sampling (CDS) circuit configured to generate a first sampling signal by performing CDS sampling on the active pixel output signal and to generate a first comparison signal by comparing the first sampling signal with a reference signal, the first CDS circuit being configured to generate the first sampling signal in response to a ramp signal and the active pixel output signal; and
a second CDS circuit configured to generate a second sampling signal by performing CDS sampling on the OB pixel output signal and to generate a second comparison signal by comparing the second sampling signal with the reference signal, the second CDS circuit being configured to generate the second sampling signal in response to a DC signal and the OB pixel output signal, wherein the second CDS circuit includes:
 a differential comparator including a first input terminal and a second input terminal, the second input terminal receiving the reference signal;
 a first switch configured to control transmission of the OB pixel output signal;
 a second switch configured to control transmission of the DC signal;
 a capacitor between an output of the first switch and an output of the second switch;
 a signal storing capacitor between the output of the first switch and the first input terminal, the signal storing capacitor providing the second sampling signal to the first input terminal of the differential comparator; and
 a third switch connected between an output terminal of the differential comparator and the first input terminal.

6. The device as claimed in claim 5, further comprising:
a first buffering circuit configured to generate a mid signal by buffering an input analog signal;
a second buffering circuit configured to generate the DC signal by buffering the mid signal;
a fourth switch configured to output a signal input to the first input terminal or an output signal of the first buffering circuit in response to a switching signal; and
a third buffering circuit configured to generate the reference signal by buffering an output signal of the fourth switch.

7. A signal processing method of an image pick-up device, the method comprising:
- generating a reference signal;
- generating a first sampling signal by performing correlated double sampling on an active pixel output signal output from an active pixel, generating the first sampling signal being in accordance with a ramp signal and the active pixel output signal
- first comparing the first sampling signal with the reference signal;
- outputting a first comparison signal, for generating a digital signal, resulting from first comparing;
- generating a second sampling signal by performing correlated double sampling on an OB pixel output signal output from an optical black (OB) pixel, generating the second sampling signal being in accordance with a DC signal and the OB pixel output signal;
- second comparing the second sampling signal with the reference signal; and
- outputting a second comparison signal resulting from second comparing,
- wherein generating the reference signal includes outputting a mid signal related to the DC signal or the second sampling signal in response to a switching signal, and
- wherein generating the reference signal further includes:
  - generating the mid signal by buffering an input analog signal;
  - generating the DC signal by buffering the mid signal;
  - switching between the mid signal and one of the second sampling and second comparison signals in response to the switching signal; and
  - outputting the reference signal by buffering an output signal from switching.

8. A signal processing method of an image pick-up device, the method comprising:
- generating a reference signal;
- generating a first sampling signal by performing correlated double sampling on an active pixel output signal output from an active pixel, generating the first sampling signal being in accordance with a ramp signal and the active pixel output signal
- first comparing the first sampling signal with the reference signal;
- outputting a first comparison signal, for generating a digital signal, resulting from first comparing;
- generating a second sampling signal by performing correlated double sampling on an OB pixel output signal output from an optical black (OB) pixel, generating the second sampling signal being in accordance with a DC signal and the OB pixel output signal;
- second comparing the second sampling signal with the reference signal; and
- outputting a second comparison signal resulting from second comparing,
- wherein outputting the second comparison signal includes:
- supplying the reference signal to a second input terminal of a differential comparator;
- controlling transmission of the OB pixel output signal using a first switch;
- controlling transmission of the DC signal using a second switch;
- supplying the second sampling signal to a first input terminal of the differential comparator from a signal storing capacitor between the output of the first switch and the first input terminal; and
- controlling supply of the second sampling signal and the second comparison signal to the first input terminal using a third switch.

9. The method as claimed in claim 8, further comprising:
generating a mid signal by buffering an input analog signal;
generating the DC signal by buffering the mid signal;
supplying a signal input to the first input terminal or the mid signal in response to a switching signal; and
generating the reference signal by buffering an output of supplying.

* * * * *